United States Patent
Hofmann et al.

(10) Patent No.: US 6,445,046 B1
(45) Date of Patent: Sep. 3, 2002

(54) MEMORY CELL ARRANGEMENT AND PROCESS FOR MANUFACTURING THE SAME

(75) Inventors: Franz Hofmann, München; Josef Willer, Riemerling; Hans Reisinger, Grünwald; Paul Werner von Basse, Wolfratshausen; Wolfgang Krautschneider, Hohenthann, all of (DE)

(73) Assignee: Siemens Aktiengesellschaft, Münich (DE)

( * ) Notice: Subject to any disclaimer, the term of this patent is extended or adjusted under 35 U.S.C. 154(b) by 0 days.

(21) Appl. No.: 09/331,034

(22) PCT Filed: Nov. 20, 1997

(86) PCT No.: PCT/DE97/02730

§ 371 (c)(1),
(2), (4) Date: Jun. 15, 1999

(87) PCT Pub. No.: WO98/27594

PCT Pub. Date: Jun. 25, 1998

(30) Foreign Application Priority Data

Dec. 17, 1996 (DE) .......................................... 196 52 547

(51) Int. Cl.[7] .............................................. H01L 29/772
(52) U.S. Cl. ..................................... 257/390; 257/411
(58) Field of Search ................................ 257/410, 411, 257/390

(56) References Cited

U.S. PATENT DOCUMENTS

| | | | |
|---|---|---|---|
| 3,731,163 A | 5/1973 | Shuskus | |
| 4,047,974 A | 9/1977 | Harari | |
| 5,317,534 A | 5/1994 | Choi et al. | |
| 5,343,423 A | 8/1994 | Shimoji | |
| 5,393,233 A | 2/1995 | Hong et al. | |
| 5,768,192 A | * 6/1998 | Eitan | |
| 5,814,853 A | * 9/1998 | Chen | |
| 5,850,091 A | * 12/1998 | Li et al. | |
| 5,920,099 A | * 7/1999 | Krautschneider et al. | |
| 6,310,373 B1 | * 10/2001 | Azuma et al. | |

FOREIGN PATENT DOCUMENTS

| | | |
|---|---|---|
| DE | 195 10 042 | 9/1996 |
| EP | 0 599 318 | 6/1994 |
| EP | 0 673 070 | 9/1995 |
| EP | 0 783 180 | 7/1997 |
| JP | 3-21069 | 1/1991 |
| JP | 5-29584 | 2/1993 |
| JP | 5-251669 | 9/1993 |

OTHER PUBLICATIONS

S.M. Sze, "Semiconductor Devices Physics and Technology", John Wiley & Sons, 486–490.

\* cited by examiner

*Primary Examiner*—George Fourson
*Assistant Examiner*—Joannie Adelle Garcia
(74) *Attorney, Agent, or Firm*—Schiff Hardin & Waite

(57) ABSTRACT

A number of memory cell lines insulated from one another and that respectively comprise a first doped region and a second doped region between which a gate dielectric, which contains a material with charge carrier traps and a number of gate electrodes. The spacing of neighboring gate electrodes is smaller than the dimensions of the gate electrodes. The information is stored by introduction of charge carriers into the gate dielectric. The gate electrodes are preferably manufactured with the assistance of a spacer technique.

6 Claims, 14 Drawing Sheets

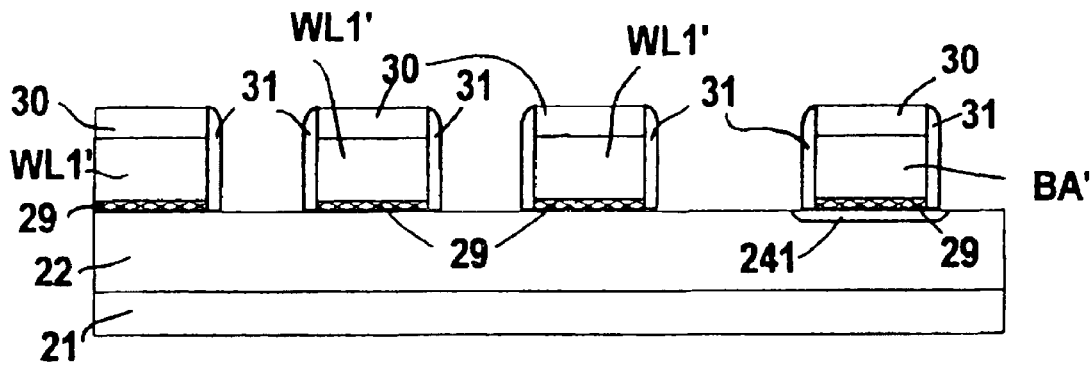
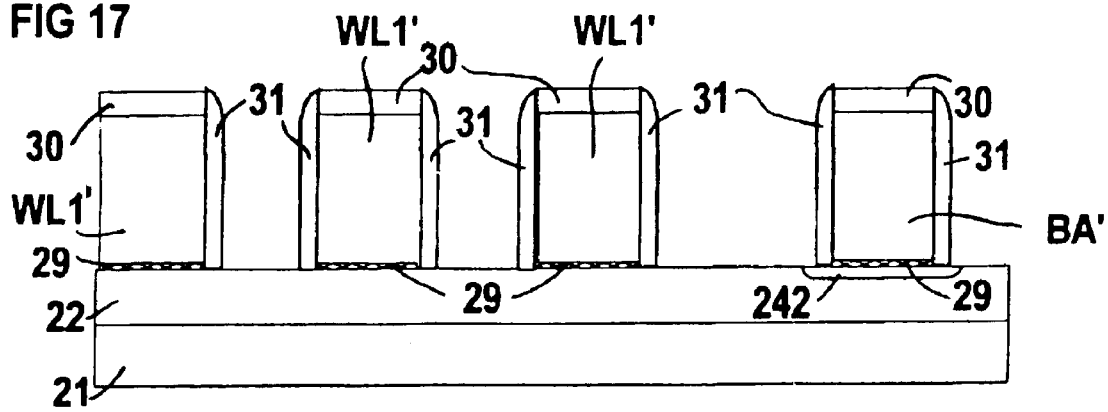

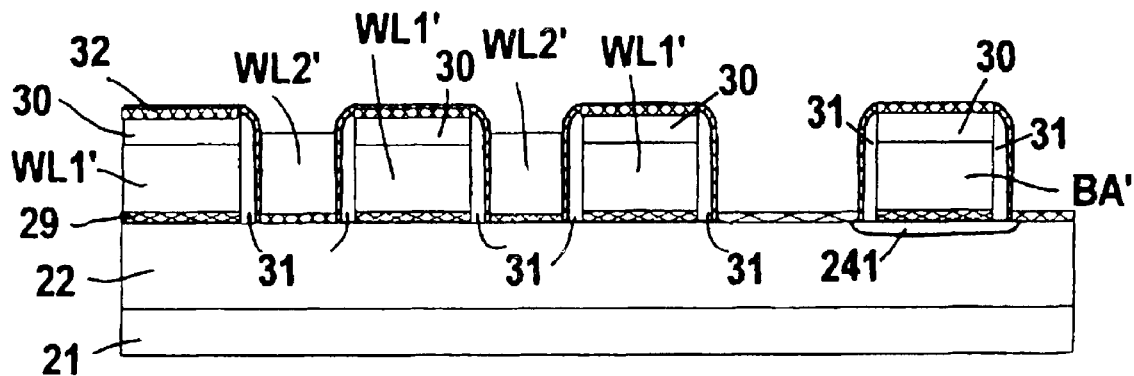
FIG 20
FIG 21
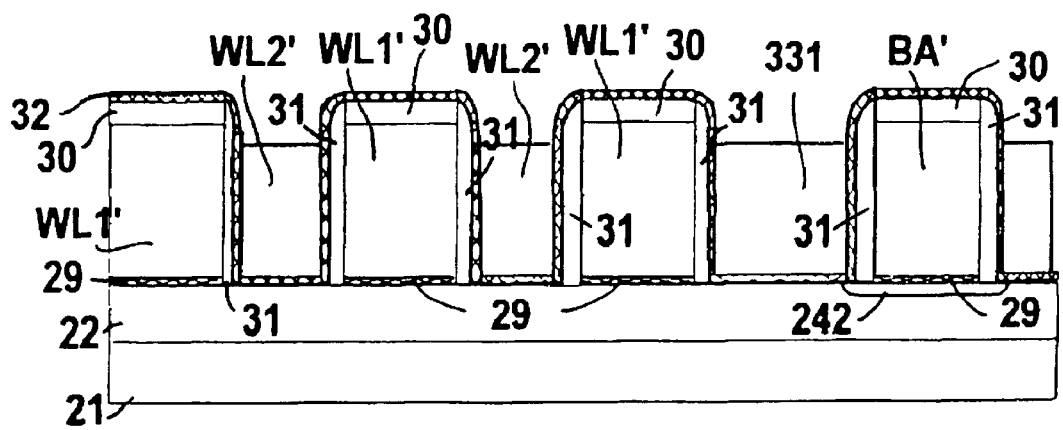

MEMORY CELL ARRANGEMENT AND PROCESS FOR MANUFACTURING THE SAME

Memories in which data is permanently written are required for many electronic systems. Such memories are referred to as, among other things, read-only memories, read memories or read-only memory.

Compact disks are employed as read memories for very large data sets. These are plastic disks with a coating of aluminum in which two types of dot-like depressions are arranged. The information is digitally stored in the arrangement of these depressions. For reading data stored on a compact disk, the disk is mechanically rotated in a read device and the dot-like depressions are scanned Five gigabits of information can be stored on a compact disk.

A read device comprises moving parts that are subject to mechanical wear, that require a comparatively large volume, and that only allow a slow data access. Further, the read device is sensitive to jolts and can therefore be applied in only limited fashion in mobile systems.

Read-only memories on a semiconductor basis, by contrast, allow a random access to the stored information. Over and above this, they can be utilized for mobile systems since a mechanical drive is not required for reading the information. MOS transistors are usually employed in these read-only memories. Whether a current flows through the transistor or not is evaluated in the read process. Stored information is correspondingly allocated. Technically, the storing of the information is usually effected in that the MOS transistors exhibit different cut-off voltages due to different implantations in the channel region.

A storage density that can be achieved in read-only memories on a semiconductor basis is dependent on an area requirement per memory cell.

German Patent Application No. DE 195 10 042 has proposed a read-only memory cell arrangement that comprises MOS transistors arranged in lines. The MOS transistors are series-connected in each line. In order to increase the storage density, neighboring lines are respectively arranged at the floor of strip-shaped longitudinal trenches and at the surface of a substrate between neighboring, strip-shaped longitudinal trenches. Source/drain regions connected to one another are fashioned as an interconnect, doped region. The MOS transistors are read by a line-by-line arive similar to a "NAND" architecture.

The programming of the described memory cell arrangements ensues during manufacture. Memories into which data can be written by electrical programming, however, are required for many applications. The storing of information in electrically programmable memory cell arrangements is usually effected in that a floating gate that can be charged with an electrical charge or a in that double layer of $SiO_2$ and $Si_3N_4$ as gate dielectric at whose boundary surface electrical charge carriers can be held fast at traps is provided between the gate and the channel region of the MOS transistors. The cut-off voltage of the MOS transistor is dependent on the charge located on the floating gate or, the traps. This property is utilized for electrical programming (see, for example, S. M. Sze, Semiconductor Devices, John Wiley, pages 486 through 490).

SUMMARY OF THE INVENTION

It is an object of the present to provide a memory cell arrangement that is electrically programmable and that is suitable for storing large data sets. It is further object of the invention to provide a method for the manufacture thereof.

These objectives are achieved in accordance with the invention in a memory cell arrangement and a method for the manufacture thereof.

The memory cell arrangement comprises a number of memory cell lines in a semiconductor substrate. Neighboring memory cell lines are insulated from one another.

The memory cell lines respectively comprise a first doped region and a second doped region. A gate dielectric and a number of gate electrodes arranged next to one another are arranged at a principal surface of the semiconductor substrate between the first doped region and the second doped region. The spacing between neighboring gate electrodes is thereby less than the dimensions of the gate electrodes parallel to the connecting line between the first doped region and the second doped region. The gate dielectric contains a material having charge carrier traps.

Traps have the properties of trapping charge carriers, specifically electrons. For electrical programming, the gate electrodes are wired such that charge carriers corresponding to the information to be stored proceed into the gate dielectric under the gate electrode and are held fast by the traps. Since the charge carriers are trapped in the traps, the information is durably stored. The programmed memory cell arrangement therefore represents a read-only memory cell arrangement. The programming can ensue both by Fowler-Nordheim-tunneling as well by hot electron injection. Charge carriers can be removed from the traps by reversing the polarities in the Fowler-Nordheim tunneling, so that the programming of the memory cell arrangement can be modified.

The invention is based on the following considerations: when driving a line in which series-connected MOS transistors are arranged in the sense of an "NAND" architecture, the gate electrodes of the MOS transistors are wired such that all MOS transistors except the selected MOS transistors conduct, regardless of the cut-off voltage of the individual transistor that is not selected. This is effected in that a voltage is applied to the gate electrode that is higher than the highest cut-off voltage that occurs. The gate electrode of the selected MOS transistor, by contrast, is charged with a voltage that lies between the cut-off voltages of the MOS transistors. An evaluation is made to determine whether a current flows across the series-connected MOS transistors or not. When a current flows, then the information corresponding to the lower cut-off voltage is stored in the selected MOS transistor. When no current flows, then the information is stored corresponding to the higher cut-off voltage.

The invention makes use of the principle that most source/drain regions of these MOS transistors act merely as a conductive connection between neighboring, conductive channels upon read-out. A doped region corresponding to a source/drain region is therefore arranged only at the start and at the end of each memory cell line in the inventive memory cell arrangement, gate electrodes arranged tightly side-by-side between these doped regions effecting a space charge zone up to the channel region of the selected gate electrode on the basis of a corresponding wiring. In this way, the space requirement for source/drain regions arranged between two neighboring gate electrodes is eliminated in the memory cell lines. The stray field between neighboring, driven gate electrodes thereby causes the region under the interspaces between neighboring gate electrodes to be made conductive. The spacing between neighboring gate electrodes is preferably amounts to 10 through 100 nm.

In applications wherein the stray field between neighboring, driven gate electrodes is not adequate in order to make the region under the interspace between the neighboring gate electrodes conductive, it lies within the scope of the invention to modulate the dopant distribution at the surface in this region with an opposite doping. A dopant concentration in the region of $10^{17}$ cm$^{-3}$ is adequate for this purpose. This dopant concentration is clearly lower than in the first doped region and the second doped region that, like source/drain regions, exhibit a dopant concentration in the range from $10^{20}$ through $10^{21}$ cm$^{-3}$. The opposite doping merely serves for the modulation of neighboring space charge zones. It is not comparable to standard source/drain regions.

For storing data in digital form, different charge quantities are introduced into the gate dielectric under the gate electrodes, so that two different cut-off voltages arise in the arrangement. When the memory cell arrangement is to be utilized for polyvalent logic, then the gate dielectric is charged with different charge quantities in the programming by corresponding voltage and time conditions suck that more than two different cut-off voltages are realized dependent on the information stored.

According to one embodiment of the invention, the gate dielectric is fashioned as a dielectric multiple layer wherein at least one layer is provided that, compared to at least one further layer in the dielectric multiple layer, exhibits an increased charge carrier capture cross-section. The traps are localized at the boundary surface between the two layers. The dielectric multiple layer preferably comprises a $SiO_2$ layer, and a$Si_3N_4$ and a $SiO_2$ layer (what is referred to as ONO). Alternatively, the dielectric multiple layer can be composed of other materials, whereby the layer having the increased charge carrier capture cross-section is composed, for example, of $Si_3N_4$, $Ta_2O_5$, $Al_2O_3$ or of $TiO_2$ and the neighboring layer is composed of $SiO_2$, $Si_3N_4$, or $Al_2O_3$. Further, the dielectric multiple layer can comprise more than three layer or fewer than three layers.

Alternatively, the gate dielectric can comprise a dielectric layer of such as , $SiO_2$ into which foreign atoms, for example W, Pt, Cr, Ni, Pd or Ir, are embedded. The embedded foreign atoms can be introduced by implantation, by addition in an oxidation or by diffusion. The embedded foreign atoms form the traps in this case.

Neighboring memory cell lines can be insulated by insulating the trenches arranged therebetween or the pn-junctions arranged therebetween or can be insulated in that parallel, strip-shaped trenches are provided in the principal surface of the semiconductor substrate, and the memory cell lines are respectively arranged in alternation at the floor of the trenches and at the principal surface between neighboring trenches.

The employment of insulating trenches or insulating pn-junctions between neighboring memory cell lines has the advantage that the memory cell arrangement is planar, which reduces the number of required process steps and the process complexity.

The insulation of the neighboring memory cell lines by arrangement at the floor and between neighboring trenches, by contrast, enables a further enhancement and of the storage density, since the insulation between neighboring memory cell lines is realized by trench wall.

The memory cell lines act as bit lines in the memory cell arrangement. The gate electrodes are connected to word lines proceeding transversely relative to the memory cell lines. Preferably, the gate electrodes are fashioned strip-shaped of conductive material, so that the strip-shaped gate electrodes form the word lines.

When the gate electrodes are formed in a tight grid, for example with a spacing between neighboring gate electrodes having a minimum structural size F, then it lies within the scope of the invention to provide the gate electrodes with expanded portions at which contacts are applied for easier contacting of the gate electrodes. The expanded portions of neighboring gate electrodes are thereby arranged offset relative to one another. The gate electrodes are preferably formed as strip-shaped structures, wherein steps are provided in the long sides of the gate electrodes in the region of the expanded portions. As a result of an offset arrangement of these steps along neighboring gate electrodes, the additional space requirement for the expanded portions is limited to the width of an expanded portion.

For driving the bit lines, it lies within the scope of the invention to merge a number of neighboring bit lines in a node and to provide a selection switch or a decoder between the node and the doped region that ends the memory cell line. To that end, at least one MOS transistor is respectively formed between the node and the doped region, this MOS transistor being driveable via a selection electrode. The selection electrode is thereby realized as a selection line that proceeds transversely relative to the bit lines. Such a doping is produced under the corresponding selection line by a channel implantation at the points of intersection of the selection line with the bit line, which should exhibit no selection transistor at the point of intersection, namely such that the parasitic MOS transistor formed under the selection line exhibits such a low cut-off voltage that it conducts regardless of whether a voltage is applied to the selection line or not.

When a selection switch is formed between the node and the doped regions, then the number of selection lines formed is the same as the number of bit lines that are merged. The selection transistors are generated along the diagonals of the intersecting points between the selection lines and the bit lines.

When a decoder is formed between the node and the doped regions, then, when $2^n$ bit lines are merged in the node, 2n selection lines are formed. Two neighboring selection lines are thereby complementary relative to one another with respect to the arrangement of the selection transistors. MOS transistors are arranged next to one another or, no MOS transistors are arranged in every $n^{th}$ selection lying pair at respectively $2^{n-1}$ intersecting points of the selection lines with the bit lines.

For manufacturing the memory cell arrangement, a number of memory cell lines that are insulated from one another are generated in a semiconductor substrate, preferably a monocrystalline silicon wafer or/a silicon layer of a SOI substrate. A first doped region and a second doped region are formed for each memory cell line in the semiconductor substrate.

A dielectric layer that contains a material having charge carrier traps is formed. A first electrode layer is generated thereon and structured for forming first gate electrodes. Spaces are formed at the side walls of the first gate electrodes. A second dielectric layer is formed that contains a material having charge carrier traps. For forming second gate electrodes, a second electrode layer having essentially conformal edge coverage is generated and structured. The first gate electrodes and the second gate electrodes are respectively arranged next to one another, wherein the spacing between neighboring gate electrodes is smaller than the dimensions of the gate electrodes parallel to the connecting line between the first doped region and the second doped region.

It lies within the scope of the invention to selectively remove the spacers between the first gate electrodes and the second electrodes relative to the first gate electrodes and the second gate electrodes and to undertake an opposite self-aligned doping, thereby modulating the doping of the semiconductor substrate in the region between the first gate electrodes and the second gate electrodes. The opposite doping ensues with a dopant concentration in a range between below $5 \times 10^{17}$ cm$^{-3}$. Preferably, the opposite doping is set to a somewhat higher value, for example to two to three times the dopant concentration that is employed as channel doping of a MOS transistor in the technology employed.

For insulation between neighboring memory cell lines, it lies within the scope of the invention to form strip-shaped insulation trenches between the neighboring memory cell lines with the assistance of a shallow trench isolation (STI) technology. When the gate electrodes are formed with a spacing corresponding to a minimum structural size F and when the memory cell lines as well as the isolation trenches respectively exhibit a width that is Also F, then an area requirement per memory cell of 2F$^2$ derives in this case, leaving the surface requirement of the first doped regions and of the second doped regions out of consideration.

It lies within the scope of the invention to insulate neighboring memory cell lines in that they are respectively formed in alternation at the floor of stripe-shaped, essentially parallel trenches and between the trenches at the principal surface of the semiconductor substrate. In this case, the sidewall of the trenches acts as insulation between the neighboring memory cell lines. When, in this case, the gate electrodes are formed with a spacing between their centers having a minimum structural size F and the trenches are Also formed with a spacing of their centers having a structural size F, then, leaving the space requirement for the first doped regions of the second doped regions out of consideration, a space requirement per memory cell of 1F$^2$ derives.

DESCRIPTION OF THE DRAWINGS

FIG. 16 is a cross-section referenced A—A in FIG. 9 after formation of spacers at the sidewalls of the first word lines.

FIG. 17 is a cross-section referenced B—B in FIG. 9 after formation of the spacers at sidewalls of the first word lines.

FIG. 20 is a cross-section referenced A—A in FIG. 9 after formation of second word lines by structuring the second electrode layer.

FIG. 21 is a cross-section referenced B—B in FIG. 9 after formation of the second word lines.

DESCRIPTION OF THE PRESENTLY PREFERRED EMBODIMENTS

Figure 1:
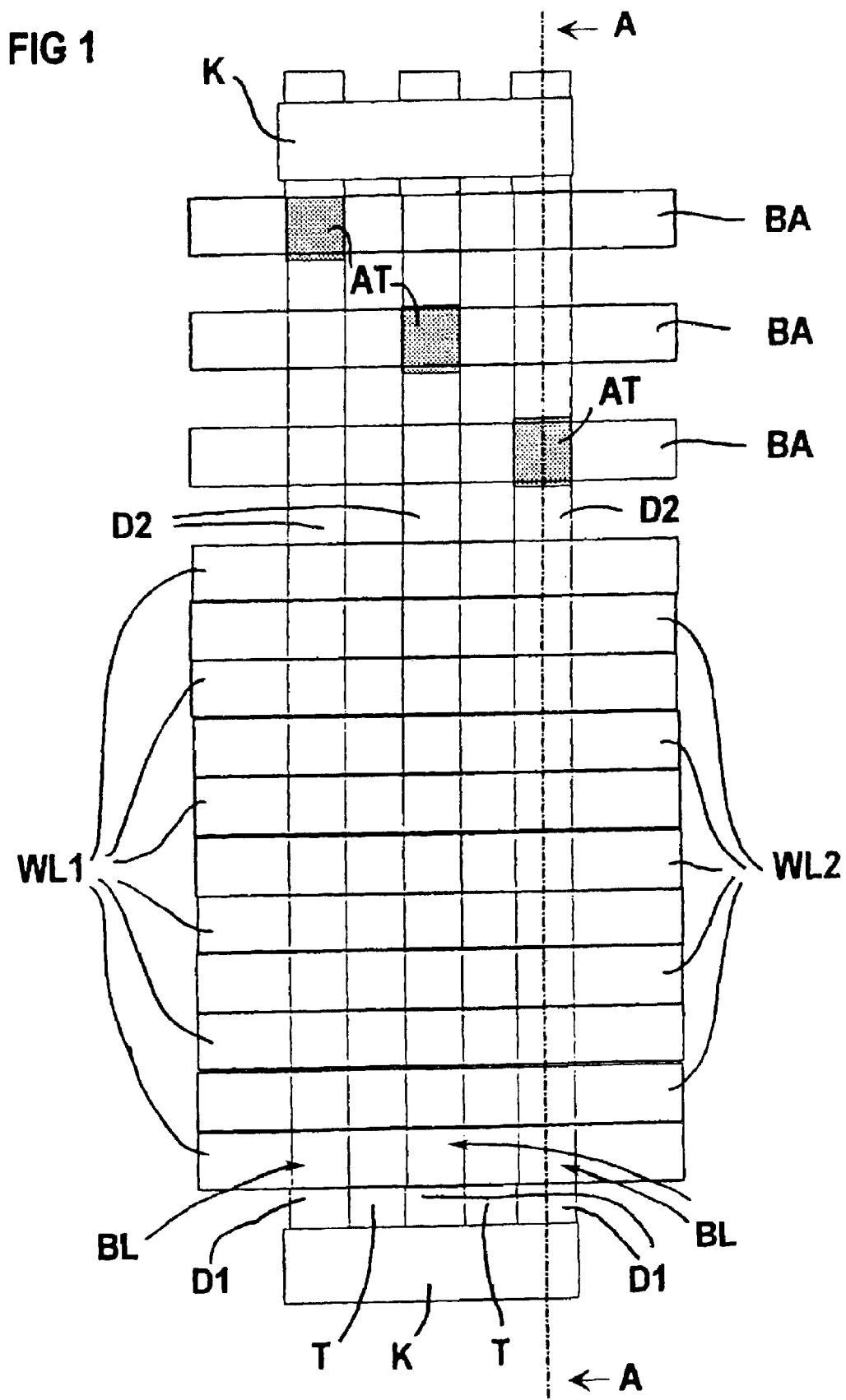
FIG. 1 is a plan view of a memory cell arrangement wherein neighboring memory cell lines are insulated from one another by isolating trenches.

Referring to FIG. 1, a memory cell arrangement comprises first word lines WL1 and second word lines WL2 that are respectively arranged in alternation with one another. Bit lines BL proceed transversely thereto, these respectively comprising memory cell lines with a first doped region D1, a second doped region D2 and gate dielectric and gate electrodes arranged therebetween that are respectively formed by the corresponding part of the first word lines WL1 and of the second word lines WL2. Neighboring bit lines BL are insulated from one another by isolating trenches T.

The spacing between the centers of neighboring bit lines BL amounts, for example, to 2F, wherein F is a minimally producible structural size, for example 0.5 μm. The spacing of the centers between neighboring first word lines WL1 and second word lines WL2 amounts to F, for example 0.5 μm. When the crossing region between one of the word lines WL1, WL2 and one of the bit lines BL is defined as a memory cell, then a space requirement of $2F^2$, for example 0.5 $\mu m^2$, derives per memory cell.

The region in which the word lines WL1, WL2 intersect with the bit lines BL corresponds to the memory cell field of the memory cell arrangement. A selection switch is provided outside this memory cell field. The selection switch comprising bit selection lines BA that cross the bit lines BL. A number of neighboring bit lines BL, for example three, are merged by a metallization M to form a node K. The same number of bit selection lines BA are arranged between the node K and the second, doped regions D2 as the number of bit lines BL are merged in the node K, i.e., for example, three.

A selection transistor that can be driven via the corresponding bit selection line BA is respectively arranged at the intersecting point of the bit lines BL with one of the bit selection lines BA per bit line BL. A doping is set at the intersecting points of the bit lines BL with the other bit selection lines of the bit selection lines BA under the bit selection line BA such that the parasitic MOS transistor formed at these intersecting points exhibits such a cutoff voltage that it conducts independently of the levels adjacent at the bit selection lines. To that end, it preferably exhibits a negative cutoff voltage. The spacing between the centers of neighboring bit selection lines BA amounts, for example, to 2F.

Figure 2:
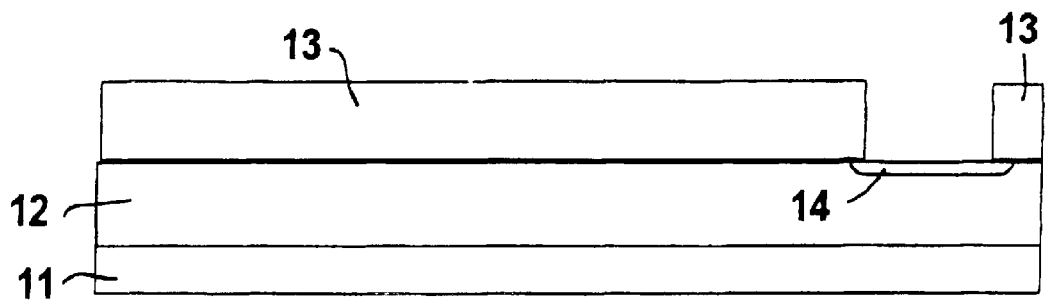
FIG. 2 is a cross-section taken along the line A—A in FIG. 1 through a semiconductor substrate after a channel implantation for setting the cut-off voltage of a selection transistor.

For manufacturing the memory cell arrangement, a p-doped well 12 having a dopant concentration of, for example, $1\times10^{17}$ cm$^{-3}$ is formed by implantation (see FIG. 2) in a substrate 11 of, for example, p-doped monocrystalline silicon having a basic dopant concentration of $2\times10^{15}$ cm$^{-3}$. The depth of the p-doped well 12 amounts, for example, to 1 $\mu$m.

After a stray oxide is applied in a layer thickness of 5 nm, a cutoff voltage implantation ensues, for example, with boron having a dose of $3\times10^{12}$ cm$^{-2}$ and an energy of 25 keV (not shown). Subsequently, a programming mask 13, for example, as photoresist, is formed by photolithographic process steps. An implantation with n-doping ions, for example with as, is implemented with a dose of $1\times10^{14}$ cm$^{-2}$ and an energy of 40 keV, whereby the selection switch is programmed. Channel dopings 14 are thereby produced at those intersecting points of the bit selection lines BA with the bit lines BL at which no selection transistors AT are formed.

Figure 3:
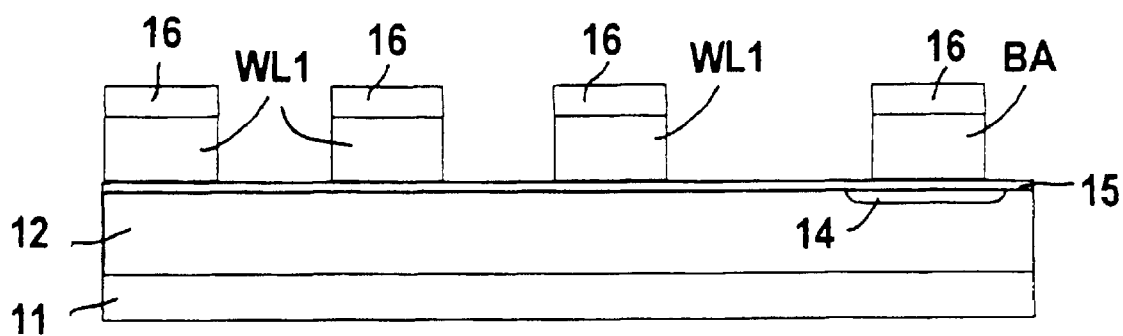
FIG. 3 is a cross-section through the semiconductor substrate of FIG. 1 after formation of a first dielectric layer, first gate electrodes and selection lines.

After the removal of the programming mask 13 and of the stray oxide not shown, a first dielectric layer 15 is formed surface-wide (see FIG. 3). The first dielectric layer 15 is formed as triple layer of a first silicon oxide layer having a thickness of 3 nm, of a silicon nitride layer having a thickness of 8 nm and of a second silicon oxide layer having a thickness of 4 nm.

By deposition of a first electrode layer and of a first SiO$_2$ layer and subsequent structuring by, for example, anisotropic etching, the first word lines WL1 and the bit selection lines BA are formed, these being respectively covered by a first SiO$_2$ structure 16 (see FIG. 3). The first electrode layer is formed, for example, of doped polysilicon in a layer thickness of, for example, 0.4 $\mu$m, being formed by in situ-doped deposition or undoped deposition and subsequent doping of the implantation or by diffusion. The first electrode layer can also be formed of metal silicide and/or metal.

The first SiO$_2$ layer is formed, for example, in a thickness of 200 nm in a TEOS process. The structuring ensues, for example, by anisotropic etching with CHF$_3$.

Figure 4:
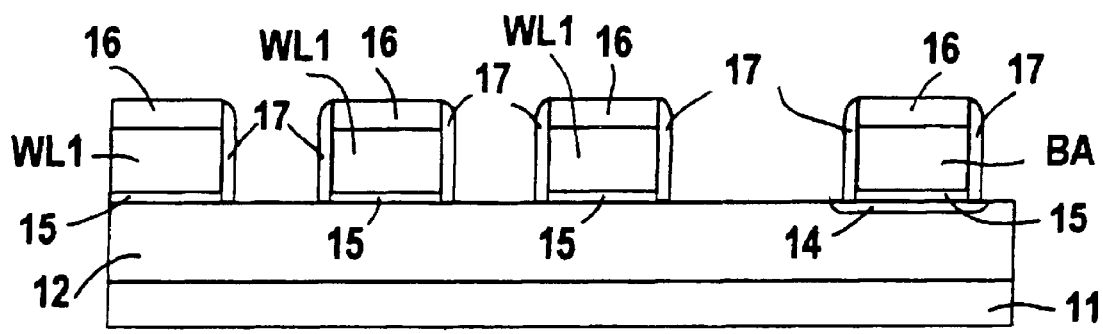
FIG. 4 is a cross-section through the semiconductor substrate of FIG. 1 after structuring of a first dielectric layer and after formation of spacers at sidewalls of the first gate electrode.

The first dielectric layer 15 is subsequently structured by dry etching with CHF$_3$. Spacers 17 at the sidewalls of the first word lines WL1 and of the bit selection lines BA are formed by deposition of a further SiO$_2$ layer, for example in a TEOS method, or from phosphorous silicate glass see FIG. 4. The spacers 17 comprise a width of approximately 50 nm. A thickness of 50 nm for the further SiO$_2$ layer is required for this purpose. The spacer 17 etching ensues with, for example, CHF$_3$.

Figure 5:
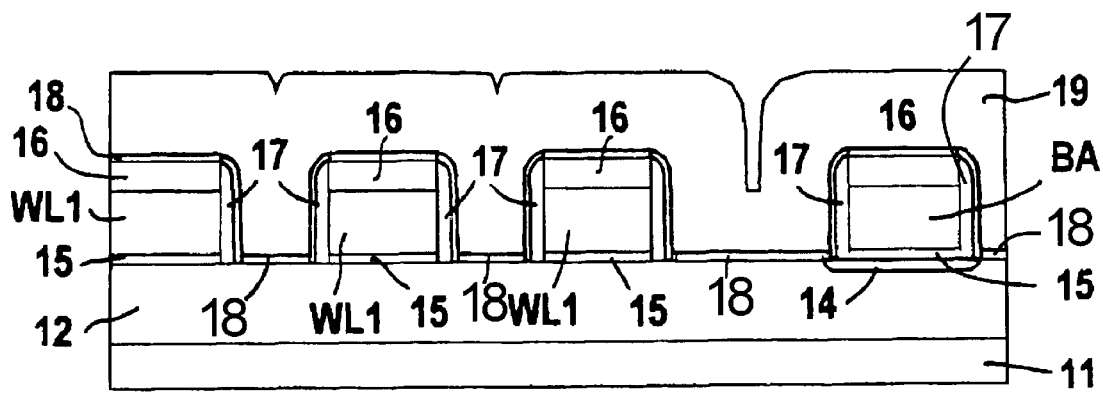
FIG. 5 is a cross-section through the semiconductor substrate of FIG. 1 after formation of a second dielectric layer and of a second electrode layer.

In order to improve the crystal quality, a sacrificial layer of silicon oxide, referred to as a sacrificial oxide, is subsequently grown and etched with hydrofluoric acid (not shown). Subsequently, a second dielectric layer 18 is generated surface-wide (see FIG. 5). The second dielectric layer 18, like the first dielectric layer 15, is formed as a triple layer of silicon oxide, silicon nitride and silicon oxide. The layer thicknesses correspond to those in the first dielectric layer 15.

Subsequently, a second electrode layer 19 of, for example, n-doped polysilicon, metal suicide and/or metal is formed surface-wide. The second electrode layer 19 is formed in a layer thickness of 0.4 $\mu$m. The second electrode layer 19 completely fills the spacings between neighboring word lines WL1.

Figure 6:
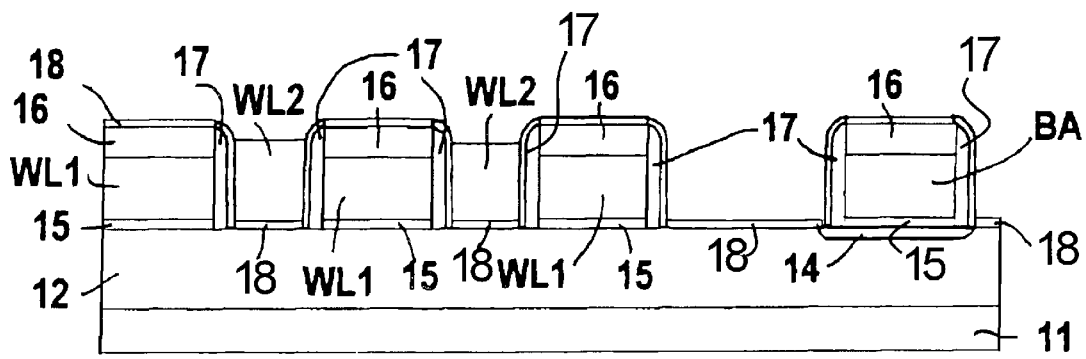
FIG. 6 is a cross-section through the semiconductor substrate of FIG. 1 after formation of second gate electrodes by structuring the second electrode layer.

The second word lines WL2 are subsequently formed by structuring the second electrode layer 19 see FIG. 6. The structuring of the second electrode layer 19 ensues by isotropic re-etching, for example with CF$_4$/O$_2$. The surface of the second dielectric layer 18 thereby acts as an etch stop. The etching is continued until the part of the second electrode layer 19 that is arranged between the bit selection lines BA and the first word line WL1 neighboring the bit selection lines BA is completely removed. What is thereby exploited is that the spacing between the bit selection lines BA and the first word line WL1 neighboring them is greater than the spacing between neighboring word lines WL1.

In applications wherein a modulation of the doping at the surface of the p-doped well 12 is required, the upper region of the second dielectric layer 18 is subsequently removed, for example with hydrofluoric acid, so that the surface of the spacer 17 is partially uncovered. Subsequently, the spacers 17 are selectively removed relative to doped polysilicon. An implantation with n-doping ions, for example with As, is implemented with a dose of $1\times10^{12}$ through $1\times10^{13}$ cm$^{-2}$ and an energy of 20 keV.

A diffusion can also ensue alternatively to the implantation. To that end, it is expedient to fill the gaps that arose due to the removal of the spacers 17 with phosphorous silicate glass that, for example, is employed as an intermediate oxide and to introduce the dopant into the p-doped well 12 by drive-out. The doping can also ensue by drive-out from the spacers 17 if these are formed of phosphorous silicate glass.

Figure 7:
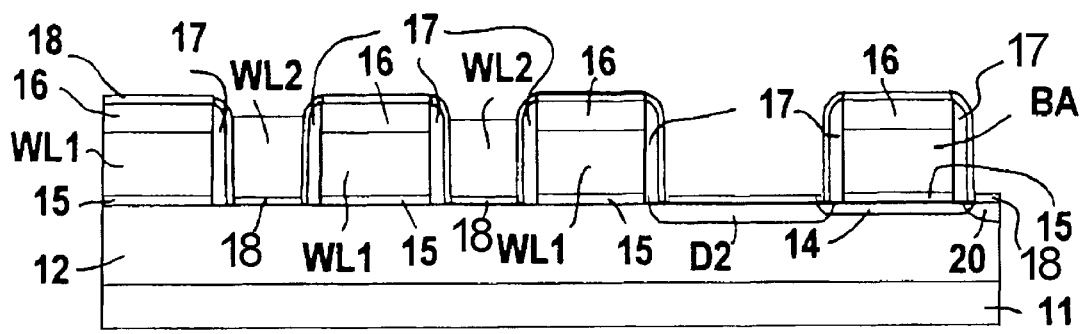
FIG. 7 is a cross-section through the semiconductor substrate of FIG. 1 after an implantation for forming first doped regions, second doped regions and source/drain regions.

Subsequently, an implantation, for example with As, is implemented with a dopant concentration of $5\times10^{15}$ cm$^{-2}$ and an energy of 80 keV, whereby first doped regions D1, the second doped regions D2 and source/drain regions 20 are formed for the selection transistors AT (see FIG. 7 and FIG. 1).

It lies within the scope of the invention to implement the implantation in two stages in the sense of a LDD and HDD implantation.

Figure 8:
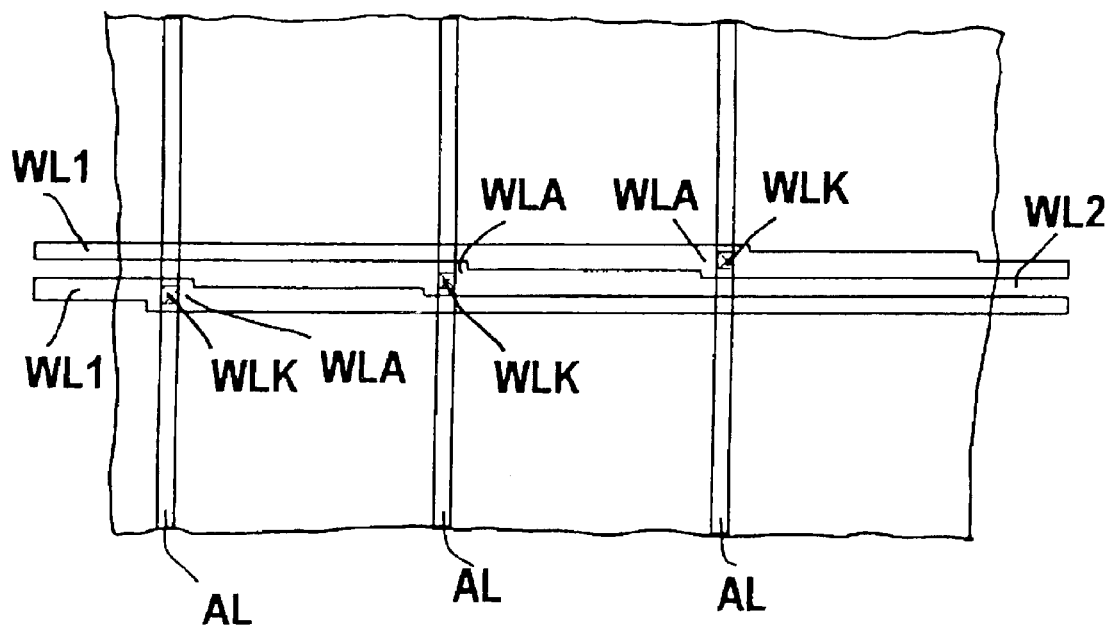
FIG. 8 shows a plan view onto the memory cell arrangement after formation of contacts to the first gate electrodes and to the second gate electrodes.

For better contactibility of the first word lines WL1 and of the second word lines WL2, these are structured such that they comprise a word line expansion WLA at which word line contacts WLK are formed to aluminum tracks AL proceeding transversely thereto (see FIG. 8). To that end, the word lines WL1, WL2 are fashioned such that they are spread at one side in the region of the word line contacts WLK. The word line expansion WLA arises in that these single-sided expanded portions are respectively arranged at opposite sides of the word line WL1, WL2. The width of the word line WL1, WL2 preceding and following the word line expansion WLA is smaller then in the region of the word line expansion WLA. Further, the middle of the word lines WL1, WL2 preceding and following the word line expansion WLA are offset relative to one another.

The word line expansions WLA of neighboring word lines WL1, WL2 are arranged offset relative to one another. The width of the word lines WL1, WL2 outside of the word line expansions WLA amounts to approximately half the width in the region of the word line expansion WLA. In this way, a reliable opening of the via holes for the formation of word line contacts WLK is assured without excessively increasing the space requirement of the word lines. Over the entire cell field, the word line expansions WLA effect an additional space requirement of approximately one word line per segment in the direction of the width of the word lines WL1, WL2. A segment comprises, for example, 32 through 128 word lines.

The memory cell arrangement is finished by deposition of an intermediate oxide, via hole etchings and application and structuring of a metal layer. These known process steps are not shown.

Figure 9:
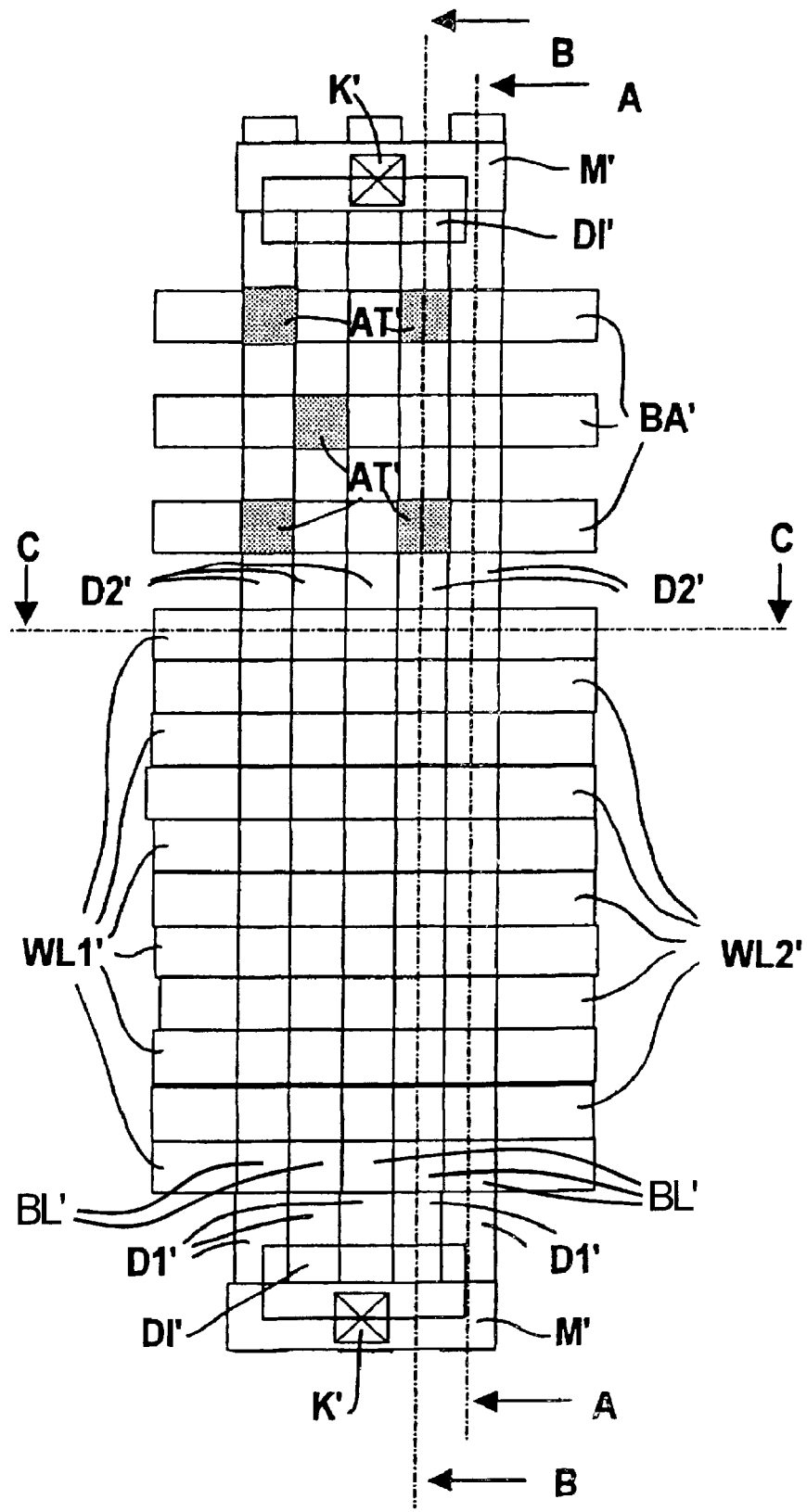
FIG. 9 shows a plan view onto a memory cell arrangement wherein neighboring memory cell lines are arranged in alternation at the floor of trenches and between neighboring trenches and are thus insulated from one another by the sidewalls of the trenches.

According to a further embodiment, a memory cell arrangement comprises first word lines WL1' and second word lines WL2' that are arranged in alternation (see FIG. 9). The spacing between the first word lines WL1' and the neighboring second word lines WL2' is thereby smaller then the width of the word lines WL1', WL2'. Bit lines BL' proceed transverse to the word lines WL1', WL2'. The bit lines BL' comprising a first doped region D1', a second doped region D2', a gate dielectric and the word lines WL1', WL2' arranged therebetween and acting as gate electrodes. The region in which the word lines WL1', WL2' and the bit lines BL' intersect corresponds to the cell field of the memory cell arrangement. The bit lines BL' are arranged in alternation at the floor of trenches and between neighboring trenches. The bit lines BL' are insulated from one another by the sidewalls of the trenches. The spacing of the centers of neighboring, first word lines WL1' and second word lines WL2' amounts, for example, to a minimum structural size F. The spacing between the centers of neighboring bit lines BL' likewise amounts to the minimal structural size F. The space requirement per memory cell, which is defined as intersection of one of the word lines WL1', WL2' with one of the bit lines BL', thus amounts $1F^2$.

A decoder that comprises bit selection lines BA' proceeding transverse to the bit lines BL' is arranged outside the cell field. Selection transistors AT of the decoder can be driven via the bit selection lines BA'. A channel doping is provided under the selection lines BA' at intersecting points of the bit selection lines BA' with the bit lines BL' at which no selection transistors AT are arranged. The channel doping causes the parasitic MOS transistor arising at this intersecting point to have such a cutoff voltage that it conducts regardless of the level adjacent at the corresponding bit selection line BA'. This cutoff voltage is preferably negative.

Neighboring bit lines BL', for example five, are connected to one another and to a node K' via a diffusion contact Dl' and a metallization M'.

Figure 10:
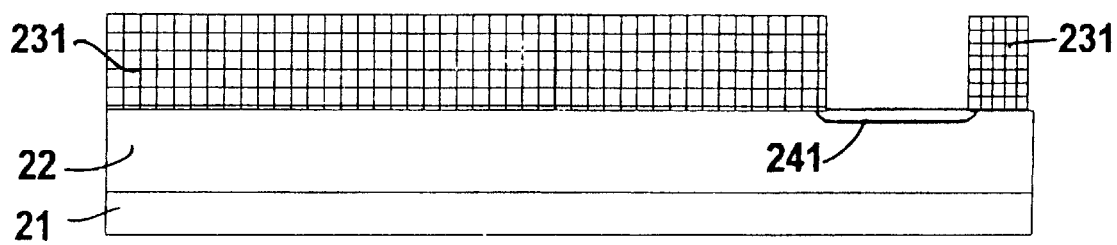
FIG. 10 is a cross-section referenced A—A in FIG. 9 through the semiconductor substrate after an implantation for programming the transistors of the decoder that are arranged between neighboring trenches.

A p-doped well 22 is formed, for example by implantation with boron, in a substrate 21 see FIG. 10, for example in a p-doped monocrystalline silicon wafer having a dopant concentration of $2 \times 10^{15}$ cm$^{-3}$ or in the silicon layer of an SOI substrate see FIG. 10. The p-doped well 22 exhibits a dopant concentration of, for example, $1 \times 10^{17}$ cm$^{-3}$ and a depth of, for example, 1 μm.

Subsequently a stray oxide is applied in a thickness of, for example, 5 nm (not shown). For setting the cutoff voltage, a boron implantation, for example with a dose of $3 \times 10^{12}$ cm$^{-2}$ and an energy of 25 keV, is implemented surface-wide.

Subsequently, a first programming mask 231 is formed, for example of photoresist, with the assistance of photolithographic process steps. An implantation with n-doping ions follows for programming the transistor of the decoder that are arranged between neighboring trenches. The implantation ensues, for example, with As, given an energy of 40 keV and a dose of $1 \times 10^{14}$ cm$^{-2}$. Channel dopings 241 are thereby formed.

Figure 11:
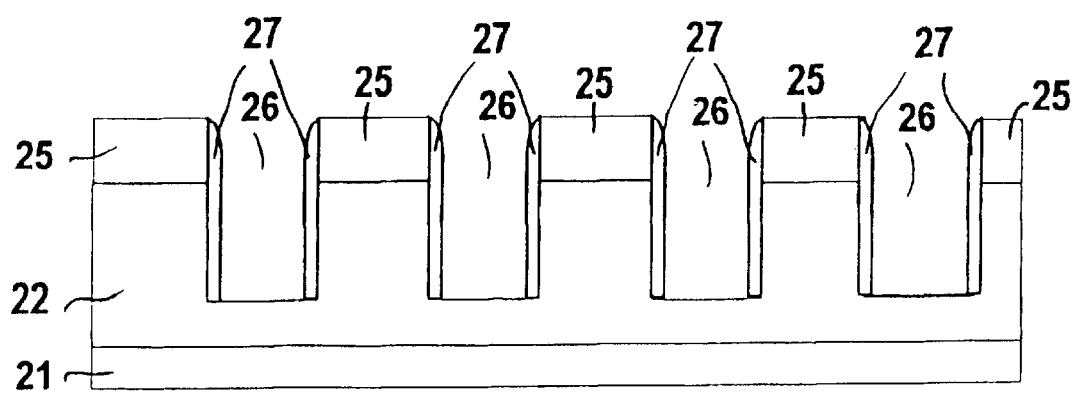
FIG. 11 is a cross-section referenced C—C in FIG. 9 after the etching of strip-shaped trenches.

After removal of the first programming mask 231, a TEOS hard mask 25 having a thickness of, for example, 300 nm is generated by deposition of a TEOS SiO$_2$ layer and subsequent structuring after the removal of the first programming mask 231 (see FIG. 11 which shows the section through the semiconductor substrate referenced C—C in FIG. 9). Strip-shaped trenches 26 are etched into the substrate by anisotropic etching, for example with Hbr, upon employment of the TEOS hard mask 25 as etching mask. The trenches 26 exhibit a depth of 0.6 μm (see FIG. 11). Subsequently, SiO$_2$ spacers 27 are formed at the sidewalls of the trenches 26 by deposition of a SiO$_2$ layer to a thickness of 50 nm and re-etching with CHF$_3$.

Subsequently, an implantation for setting the cutoff voltage of the MOS transistors to be produced at the floor of the trenches 26 is implemented surface-wide. The implantation is implemented, for example, with boron with an energy of 25 keV and a dose of $3 \times 10^{12}$ cm$^{-2}$.

Figure 12:
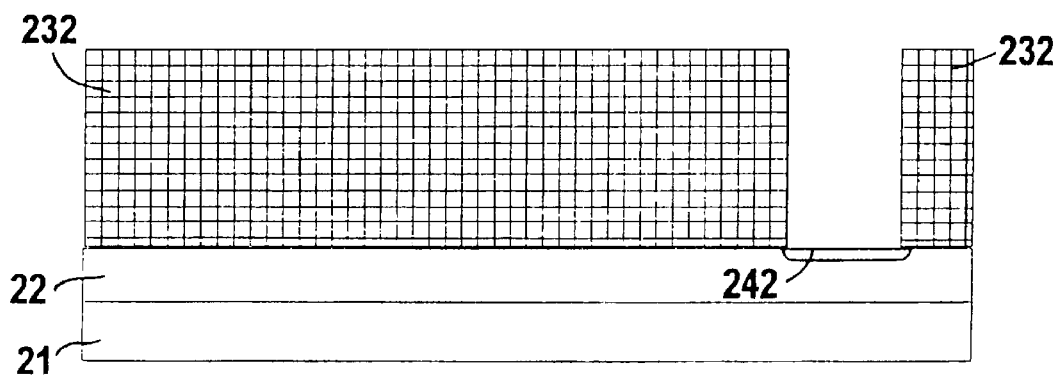
FIG. 12 is a cross-section referenced B—B in FIG. 9 after an implantation for programming the transistors of the decoder that are arranged at the floor of the strip-shaped trenches.

Next, a second programming mask 232 of, for example, photoresist is formed with the assistance of photolithographic process steps see FIG. 12. Channel dopings 242 are formed by implantation with n-doping ions, for example with As, with an energy of 40 keV and a dose of $1 \times 10^{14}$ cm$^{-2}$. MOS transistors of the decoder that are arranged at the floor of the trenches 26 are thereby programmed (see FIG. 12 which shows the section parallel to one of the trenches 26 at the floor of the trench 26 that is referenced B—B in FIG. 9). The second programming mask 232 thereby completely covers the cell field.

Figure 14:
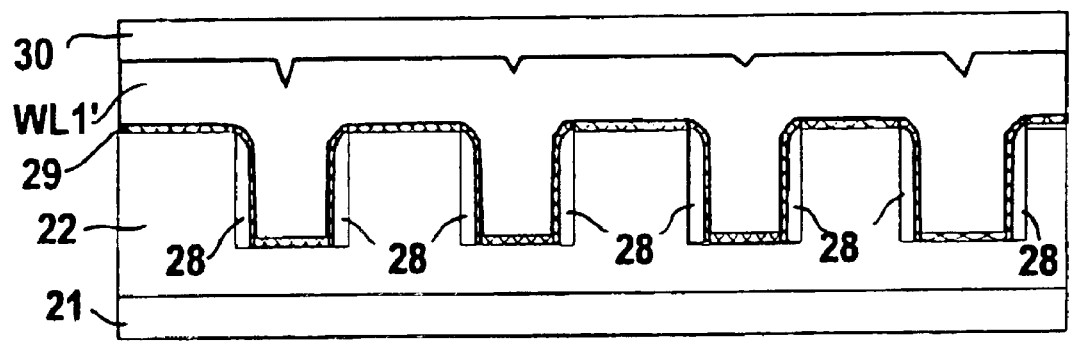
FIG. 14 is a cross-section referenced C—C in FIG. 9 after the formation of the first word lines.

After removal of the second programming mask 232 and of the hard mask 25 as well as of the SiO$_2$ spacers 27 by wet-chemical etching, for example with hydrofluoric acid, further SiO$_2$ spacers 28 are formed at the sidewalls of the trenches see (FIG. 14). To that end, a TEOS SiO$_2$ layer is deposited in a layer thickness of 80 nm and is etched with CHF$_3$ (see FIG. 14 that shows the section C—C).

Figure 13:
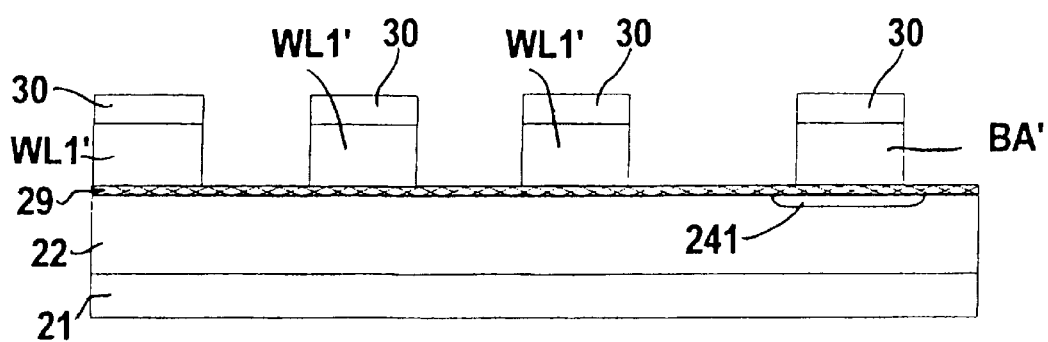
FIG. 13 is a cross-section A—A in FIG. 9 after formation of first word lines.
Figure 15:
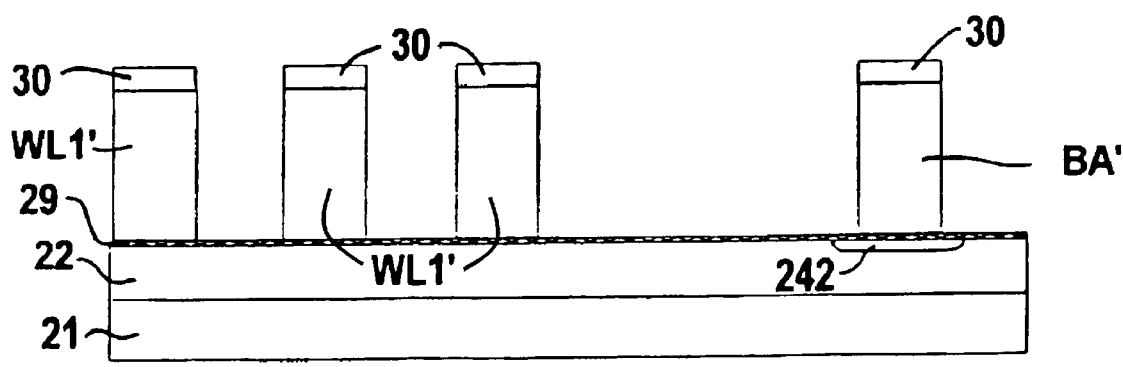
FIG. 15 is a cross-section referenced B—B in FIG. 9 after the formation of the first word lines.

A first dielectric layer 29 is formed surface-wide see (FIG. 13). The first dielectric layer 29 is formed as triple layer that comprises a first SiO$_2$ layer having a thickness of 3 nm, a Si$_3$N$_4$ layer having a thickness of 8 nm and a second SiO$_2$ layer having a thickness of 4 nm (see FIG. 13 that shows the section A—A in FIG. 9. FIG. 14 that shows the section C—C in FIG. 9 and FIG. 15 that shows the section B—B).

For forming the first word lines WL1' and a silicon oxide layer 30 covering these, the first electrode layer and a TEOS SiO$_2$ layer are subsequently deposited. The first electrode layer is formed, for example, by in situ-doped deposition of polysilicon or by undoped deposition of polysilicon and subsequent doping by implantation or diffusion, being formed in a layer thickness of 0.4 µm. The TEOS SiO$_2$ layer 30 is formed in a layer thickness of 200 nm. The structuring ensues, for example, with CHF$_3$. The first word lines WL' are formed by structuring the first electrode layer with anisotropic etching, for example with HBr. The bit selection lines BA' are simultaneously generated in the formation of the first word lines WL1'.

The first dielectric layer 29 is subsequently structured with the assistance of CHF$_3$ (see FIG. 16 that shows the section A—A in FIG. 9 and FIG. 17 that shows the section B—B in FIG. 9). Spacers 31 are formed at the sidewalls of the first word lines WL1' by deposition of an insulating layer, for example of TEOS SiO$_2$ or of phosphorous silicate glass, and by anisotropic re-etching. The re-etching ensues, for example, with CHF$_3$.

Figure 18:
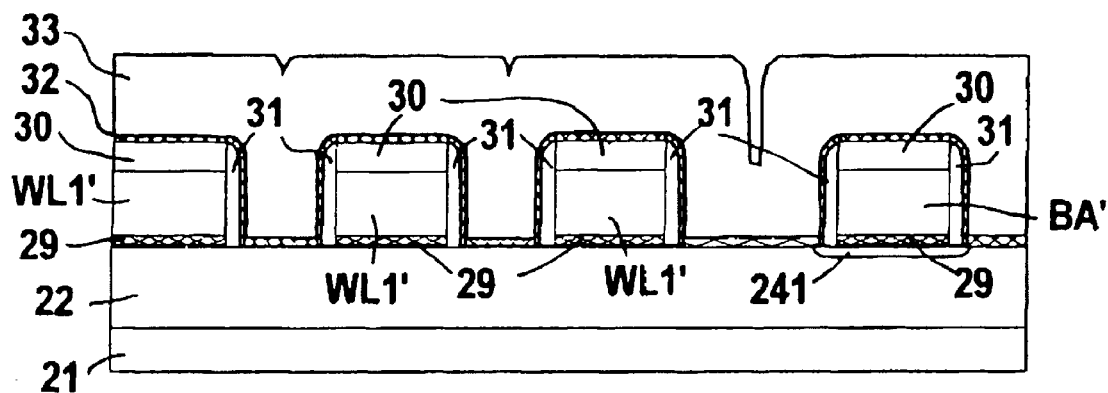
FIG. 18 is a cross-section referenced A—A in FIG. 9 after formation of a second dielectric layer and of a second electrode layer.
Figure 19:
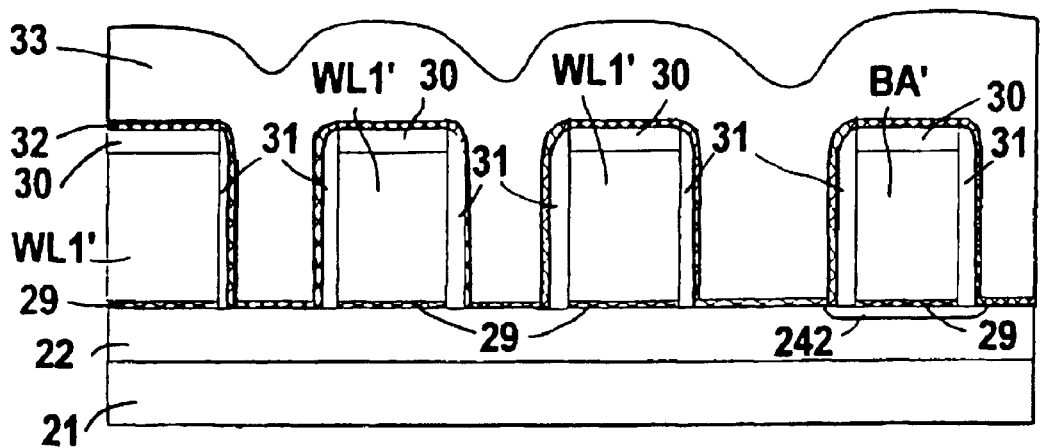
FIG. 19 is a cross-section referenced B—B in FIG. 9 after formation of a second dielectric layer and of a second electrode layer.

In order to improve the crystal quality, a sacrificial layer of silicon oxide is subsequently generated and etched (not shown). A second dielectric layer 32 is then applied surface-wide (see FIG. 18 that shows the section A—A in FIG. 9 and FIG. 19 that shows the section B—B in FIG. 9). The second dielectric layer 32 is formed, for example, as a triple layer having a first SiO$_2$ layer, a Si$_3$N$_4$ layer and a second SiO$_2$ layer. The thicknesses of these correspond to the thicknesses in the first dielectric layer 29.

A second electrode layer 33 is deposited thereon. The second electrode layer 33 is formed, for example, of doped polysilicon in a layer thickness of 0.4 µm. As a result thereof, it completely fills the interspaces between neighboring, first word lines WL1'. The second electrode layer 33 is formed, for example, by in situ-doped deposition of n-doped polysilicon or by undoped deposition of polysilicon and subsequent doping by implantation or diffusion. Alternatively, the second electrode layer 33 can be formed of metal, metal silicide or a similar conductive material that is suitable as gate electrode or, word line.

The second word lines WL2' are formed by isotropic re-etching of the second electrode layer 33 selectively relative to the second dielectric layer 32. The etching ensues, for example, with CF$_4$/O$_2$. The etching is overdrawn so that the surface of the second dielectric layer 32 between neighboring trenches and between the bit selection lines BA' and the first word line WL1' adjacent thereto is uncovered. An etching residue 331, by contrast, remains at the trench floor between the bit selection lines BA' and the first word line WL1' adjacent thereto (see FIG. 20 that shows the section A—A in FIG. 9 between neighboring trenches and FIG. 21 that shows the section B—B in FIG. 9 at the trench floor).

Figure 22:
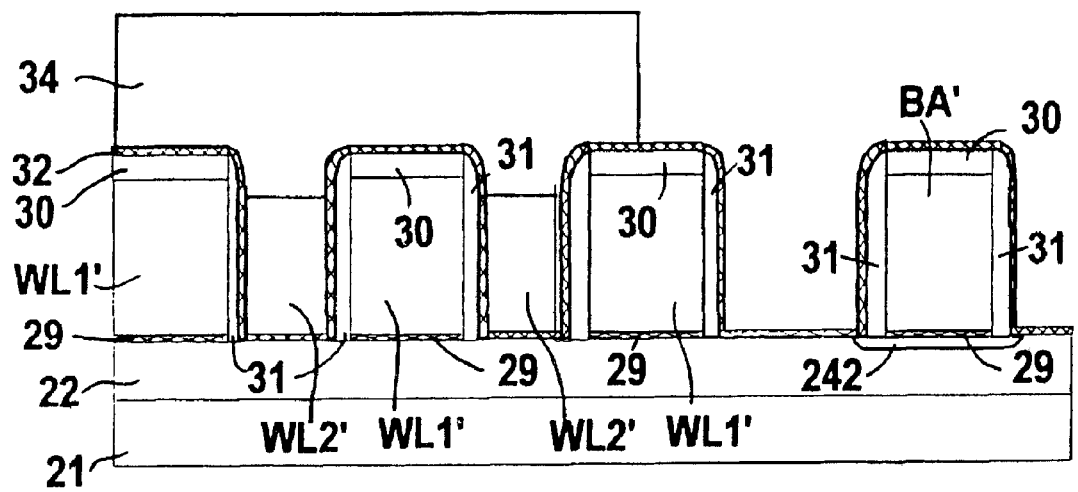
FIG. 22 is a cross-section referenced B—B in FIG. 9 after removal of etching residues of the second electrode layer at the trench floor.

Subsequently, a photoresist mask 34 is formed that covers the cell field (in FIG. 22). The etching residue 331 (see FIG. 21) at the trench floor between the cell field and the bit selection lines BA' is removed by anisotropic etching. The re-etching ensues, for example, with HBr/Cl$_2$ (see FIG. 22 that shows the section B—B in FIG. 9).

Figure 23:
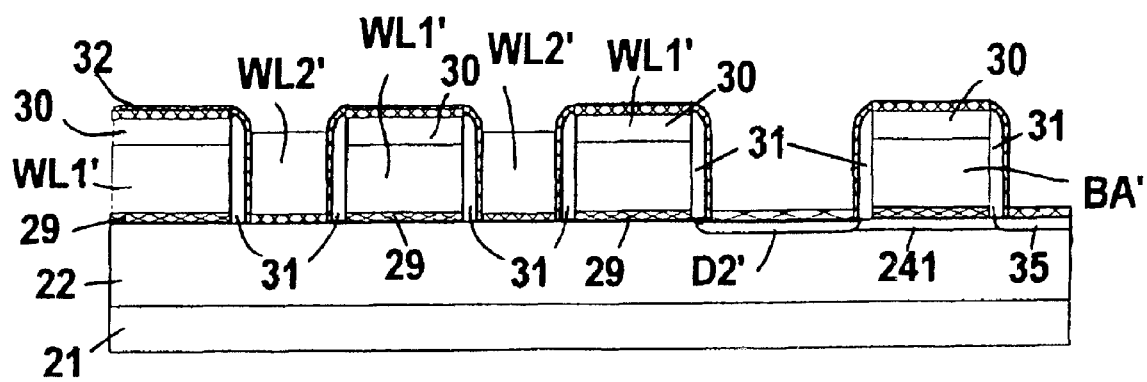
FIG. 23 is a cross-section referenced A—A in FIG. 9 after formation of the first and second doped regions and of source/drain regions.
Figure 24:
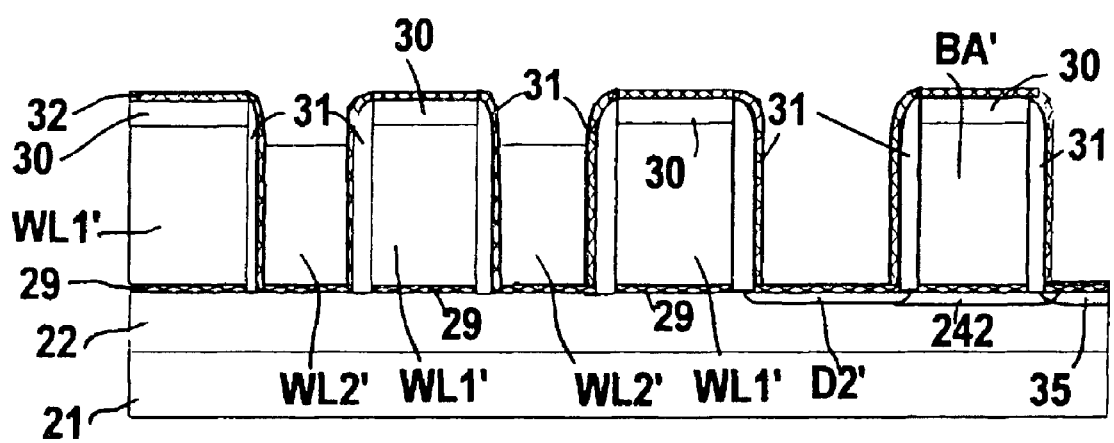
FIG. 24 is a cross-section referenced B—B in FIG. 9 after formation of the first doped regions, second doped regions and of the source/drain regions.

After removal of the photoresist mask 34, an implantation is implemented with, for example, n-doping ions for formation of the first doped regions D1', of the second doped regions D2', of the diffusion contact D1' as well as of the source/drain regions 35 of the MOS transistors of the decoder (see FIG. 9, FIG. 23 wherein the section A—A in FIG. 9 is shown and FIG. 24 that shows the section B—B in FIG. 9). The implantation ensues, for example. With As, having an energy of 80 keV and a does of 5×10$^{15}$ cm$^{-2}$.

It lies within the scope of the invention to implement the implantation in two stages in the sense of an LDD and HDD implantation.

The memory cell arrangement is finished by deposition of an intermediate oxide, via whole etchings and application and structuring of a metal layer. These known process steps are not shown.

The invention is not limited to the exemplary embodiments that have been described. In particular, the conductivity types n and p can be interchanged.

It also lies within the scope of the invention to respectively employ a multiple layer for the first dielectric layer 15, 29 and the second dielectric layer 18, 32 wherein at least one layer is provided that, compared to at least one further layer in the multiple layer, exhibits an enhanced charge carrier capture cross-section and that is composed of other materials, whereby the layer with the enhanced charge carrier capture cross-section is composed, for example, of Si$_3$N$_4$, Ta$_2$O$_5$, Al$_2$O$_3$ or TiO$_2$ and the neighboring layer is composed of SiO$_2$, Si$_3$N$_4$ or Al$_2$O$_3$. Further, the first dielectric layer 15, 29 and the second dielectric layer 18, 32 can contain a dielectric layer of, for example, SiO$_2$ in which foreign atoms, for example, W, Pt, Cr, Ni, Pd, or Ir, are embedded. The embedded foreign atoms can be introduced by implantation, by addition in an oxidation or by diffusion.

The programming of the memory cell arrangement ensues by filling the traps in the first dielectric layer 15, 29 or, the second dielectric layer 18, 32 with injection of electrons. As a result thereof, the cutoff voltage at which a conductive channel forms below the respective word lines, which acts as gate electrode, is raised. The respective value of the cutoff voltage boost can be set via time and size of the applied voltage during the programming.

The programming of the memory cell arrangement can ensue both by Fowler-Nordheim tunneling of electrons as well as by hot electron injection.

For writing the information by Fowler-Nordheim tunneling, the memory cell to be programmed is selected via the pertaining word line and bit line. The bit line of the memory cell is applied to low potential, for example to 0 volts. The pertaining word line, by contrast, is applied to high potential, for example to $V_{pr}$=12 volts. The other bit lines are boosted to a potential $V_{BL}$ that is dimensioned such that $V_{pr}$–$V_{BL}$ lies clearly below the programming voltage $V_{pr}$. The other word lines are boosted to a potential $V_{WL}$ greater than or equal to $V_{BL}$ +$V_T$, whereby $V_T$ denotes the threshold voltage. Since all other bit lines that cross the selected word line are at higher potential during the programming, the other memory cells that are connected to the selected word line are not programmed. The memory cells are interconnected in a NAND configuration. They can therefore be wired such that no drain current flows through the memory cells. This has the advantage that the entire programming procedure proceeds at very low-power.

When the programming ensues by hot electron injection, then the saturation voltage must be applied to the MOS transistor to be programmed. To that end, the bit line allocated to the memory cell is applied between ground potential and a high potential, for example $V_{BLpr}$=6 volts. The word line allocated to the memory cell is applied to a potential whereat the MOS transistor is in saturation mode. The voltage $V_{WLpr}$ at the word line is lower then $V_{BLpr}$, for example $V_{WLpr}$=4 volts. The other word lines are applied to a high potential that is higher then $V_{BLpr}$ and $V_{WLpr}$, for example $V_{WL}$=7 volts. This voltage is selected dependent on the thickness of the gate dielectric such that a Fowler-Nordheim tunneling does not yet occur. All other bit lines are applied to an identical potential at both ends, for example to $V_{BL}$=$V_{WLpr}$/2. A programming of memory cells that lie along the selected word line at other bit lines is thus suppressed and a flow of current is avoided. As a result of the saturation mode at high voltage, hot electrons that are partially injected into the gate dielectric arise in the channel region of the MOS transistor of the selected memory cell. The electrons are retained by traps in the gate dielectric and raise the threshold voltage of the MOS transistor. Dependent on information to be stored in the respective memory cell, the threshold voltage of the respective MOS transistor is correspondingly modified in this way.

The memory cell is operated in a NAND architecture. I.e., the non-selected word lines WL1, WL2 or, WL1', WL2' in a memory cell line are charged with a voltage whereat the channel region conducts, regardless of the existing charge in the gate dielectric. When the memory cell arrangement is programmed such that it comprises two different cutoff voltage values, then the selected gate electrode is charged with a voltage that lies between the first cutoff voltage value and the second cutoff voltage value. An evaluation is made as to whether a current flows across the memory cell line.

Although modifications and changes may be suggested by those of ordinary skill in the art, it is the intention of the inventors to embody within the patent warranted hereon all changes and modifications as reasonably and properly come within the scope of their contribution to the art.

We claim:

1. A memory cell arrangement in which a number of memory cell lines are arranged in a semiconductor substrate, neighboring memory cell lines being insulated from one another, the memory cell lines comprising:

a first doped region corresponding to a source/drain region arranged at a first end of each of the memory cell lines;

a second doped region corresponding to a source/drain region arranged at a second end of each of the memory cell lines;

a gate dielectric arranged between each of the first and second doped regions on a principle surface of the semiconductor substrate, the gate dielectric containing a material having charge carrier traps; and a plurality of gate electrodes arranged next to one another and on the principle surface of the semiconductor substrate between the first and second doped regions, wherein, a spacing between neighboring gate electrodes is less than the dimensions of the neighboring gate electrodes in a direction parallel to the connecting memory cell lines between the first and second doped regions.

2. The memory cell arrangement according to claim 1, further comprising parallel, strip-shaped trenches provided in the principal surface of the semiconductor substrate, wherein the memory cell lines are respectively arranged in alternation at a floor of the trenches and between neighboring trenches at the principal surface of the semiconductor substrate.

3. The memory cell arrangement according to claim 1, further comprising isolating trenches provided in the semiconductor substrate for insulation between neighboring memory cell lines, such that the isolation trenches are aligned parallel to the memory cell lines.

4. The memory cell arrangement according to claim 1, wherein the gate dielectric comprises a dielectric layer having embedded foreign atoms, the embedded foreign atoms exhibiting an enhanced charge carrier capture cross-section compared to the dielectric layer.

5. The memory cell arrangement according to claim 4, wherein the dielectric layer comprises $SiO_2$, and the embedded foreign atoms comprise at least one element selected from the group consisting of W, Pt, Cr, Ni, Pd and Ir.

6. The memory cell according to claim 1, wherein the gate dielectric comprises a dielectric multiple layer having at least one layer exhibiting an enhanced change carrier capture cross-section compared to at least one further layer, and wherein the at least one layer exhibiting an enhanced charge carrier capture cross-section comprises at least one substance selected from the group consisting of $Si_3N_4$, $Ta_2O_5$, $Al_2O_3$ and $TiO_2$, and wherein the further layer comprises at least one substance selected from the group consisting of $SiO_2$, $Si_3N_4$, and $Al_2O_3$.

* * * * *